United States Patent [19]

Burnham et al.

[11] 4,433,417
[45] Feb. 21, 1984

[54] NONPLANAR SUBSTRATE INJECTION LASERS GROWN IN VAPOR PHASE EPITAXY

[75] Inventors: Robert D. Burnham, Palo Alto; Donald R. Scifres, Los Altos; William Streifer, Palo Alto, all of Calif.

[73] Assignee: Xerox Corporation, Stamford, Conn.

[21] Appl. No.: 268,596

[22] Filed: May 29, 1981

[51] Int. Cl.³ .............................................. H01S 3/19
[52] U.S. Cl. ....................................... 372/45; 357/17; 372/46
[58] Field of Search ................ 372/45, 46, 48; 357/17

[56] References Cited

U.S. PATENT DOCUMENTS 3,978,428  8/1976  Burnham et al. ...................... 372/45
4,215,319  7/1980  Botez ..................................... 372/46

OTHER PUBLICATIONS

DuPuis: "$Ga_{1-x}Al_xAs$-GaAs Heterostructure Lasers Grown by MO-CVD", JJAP, vol. 19(19-1), pp. 415-423, 1980.

Primary Examiner—James W. Davie
Attorney, Agent, or Firm—W. Douglas Carothers, Jr.

[57] ABSTRACT

In a semiconductor injection laser with a nonplanar pattern in the substrate, growth of the plurality of layers comprising the laser structure is accomplished in vapor phase epitaxy to produce a lateral spatial thickness variation (LSTV) in the active region of the laser. The LSTV profile is one of or combination of the profiles disclosed in FIG. 2, producing an effective, although small, lateral refractive index variation in the active region, thereby permitting the maintenance of the lowest order transverse mode along the plane of the active region.

21 Claims, 26 Drawing Figures

NONPLANAR SUBSTRATE INJECTION LASERS GROWN IN VAPOR PHASE EPITAXY

BACKGROUND OF THE INVENTION

This invention relates to the injection lasers having active layers with a real refractive index waveguiding property due to a lateral spatial thickness variation (LSTV) profile in on active region of their active layers with fabrication of these profiles created by vapor phase epitaxy employing semiconductor substrates with a nonplanar pattern in their surface. The LSTV profile may be abrupt or gradual, or combination thereof, depending on the nonplanar pattern geometry and growth parameters. Specifically, this invention deals with the employment of nonplanar substrate patterns, such as, channels or mesas, of particular geometry that produce these profiles in the active layer of a multilayer semiconductor injection laser fabricated in metalorganic chemical vapor deposition (MO-CVD) or in molecular beam epitaxy (MBE), which have improved operating characteristics compared to previously known injection lasers with nonplanar active regions.

A class of lasers incorporating a nonplanar region in the active layer have been termed "nonplanar", denoting that the active layer possesses a nonplanar active region formed during laser fabrication. This nonplanar region is conventionally formed via liquid phase epitaxy (LPE) by growth of semiconductor layers over a semiconductor substrate having associated with its top surface a channel or a mesa. An example of the channelled substrate nonplanar laser (CSNP) is disclosed in U.S. Pat. No. 3,978,428 and in German OSL No. 2,716,750. The mesa substrate nonplanar laser (MSNP) is also disclosed in German OSL No. 2,716,750 and in the Article entitled, "High-Power Constricted Double-Heterojunction AlGaAs Diode Lasers for Optical Recording" by D. Botez, F. W. Spong and M. Ettenberg, *Applied Physics Letters,* Vol. 36(1), Jan. 1, 1980, pp. 4–6.

The strong interest in these types of lasers is attributed to their good operating characteristics, such as, low threshold current, linear light versus current characteristic, good temperature performance, and relatively symmetrical, anastigmatic output beam.

It has been established in research and development that semiconductor injection lasers having a nonplanar active region which includes a lateral spatial variation in the active region thickness that exhibits improved properties, such as, low threshold current, linear light output versus current characteristics and stable fundamental transverse mode control. These properties may be improved by selection of the proper spatial variation thickness and spatial variation rapidity. Nonplanar variations and rapidity are discussed in U.S. Patent Application Ser. No. 181,262 filed on Aug. 25, 1980, now U.S. Pat. No. 4,335,461, and entitled "Injection Lasers With Lateral Spatial Thickness Variations (LSTV) In the Active Layer", assigned to the assignee herein.

To date, nonplanar lasers have been successfully grown by LPE. Within the past few years, molecular beam epitaxy (MBE) and metalorganic chemical vapor deposition (MO-CVD) have become important processes in the fabrication of single crystal semiconductor integrated optical devices, including injection lasers. These two procedures, to a large extent, are replacing the conventional LPE crystal growth techniques owing to their improved control over layer thickness, crystal composition, layer smoothness, abruptness of interfaces and uniform doping profiles.

LPE processes permit nonplanar variations in layer contours and thicknesses as desired. For example, LPE growth of channelled substrate lasers produced curved contours and thickness variations in deposited layers on the substrate. However, MBE and MO-CVD processes characteristically do not produce the same type of growth variations. Depending upon deposit rate, flow rate, substrate temperature, etc., the deposited layers or films tend to "match" the contour and shape of the depositing surface. It would be desirable to start with a substrate surface having a desired contour or taper adequate to replicate the desired variations in thickness and taper in sequentially grown layers. But, it is more practical to develop the desired taper and thickness variation during growth process, as done in the past with LPE relative to nonplanar substrate patterns, and obtain better accuracy and control in the desired contour and thickness variations that MBE and MO-CVD processes would provide.

One manner of providing desired lateral spatial thickness variations in the active region in MO-CVD processing is the employment of apertured masks (either temporary or integral) during the growth process, as disclosed in U.S. Patent Application Ser. No. 231,556, filed Feb. 4, 1981 and assigned to the assignee herein. The uniform depositing phenomena in MO-CVD is "interrupted" by the presence of the mask aperture producing a deposited layer through the mask aperture that varies laterally in spatial thickness.

Without the mask structure, the epitaxial deposition of layers will tend to take on the geometric characterization of the substrate surface. If a channel or mesa is present in or on the substrate surface, the subsequently deposited MO-CVD layers will tend to take on the nonplanar profile of the channel or mesa. In the case of flat channel bottoms or mesa tops, it has been previously observed that the subsequently grown MO-CVD layers including the active layer will have corresponding flat regions, replicating the form of the nonplanar profile. See the Article entitled, "Single-longitudinal-mode CW Room-temperature $Ga_{1-x}Al_xAs$-GaAs Channel-guide Lasers Grown By Metalorganic Chemical Vapor Deposition", R. D. Dupuis and P. D. Dapkus, *Applied Physics Letters,* Vol. 33, page 724 et seq. (Oct. 15, 1978). While these regions are in a different plane relative to adjacent regions of the same layer, they have been thought to not exhibit spatial variations in thickness laterally along these flat regions. Such variations can be provided in MO-CVD processing by employing apertured masks, as previously mentioned.

SUMMARY OF THE INVENTION

We have discovered that desired active region profiles may be obtained in vapor phase epitaxy by growth over nonplanar patterns at the substrate surface producing the desired lateral spatial thickness variation (LSTV) profile depending on the size and shape of the nonplanar substrate patterns and certain growth parameters. These patterns form abrupt LSTV profiles and gradual LSTV profiles. Combinations of these two different profiles are possible. Examples of nonplanar patterns are substrate channels and mesas used in the past in fabricating these nonplanar devices. The smaller patterns have been found to provide desirable slight LSTV profiles that provide better laser operating characteristics, particularly, mode control. These very gradual LSTV profiles are not practical with LPE processing, which processing does not provide the control over layer thickness and contour that can be obtained in MO-CVD or MBE, particularly where, as here, very small thickness variations and very slight lateral profile variations are desired. The reason is well known. In LPE growth, any nonplanar pattern in the substrate will eventually grow flat. In MO-CVD or MBE, a geometrical reminescence of the nonplanar substrate pattern propagates through the deposited layers during growth. Any tendency to obscure the substrate pattern features during subsequent layer growth by producing a completely flat or linear layer is much less pronounced in these epitaxial processes as compared to LPE.

The desired abrupt or gradual LSTV profile in the active region can be produced in the vapor phase epitaxy by imposing limitations on the size of the nonplanar substrate pattern at the surface of the laser substrate, taking into consideration the thicknesses of the active layer and certain growth parameters, thereby optimizing these laser characteristics and operation. These profiles produced in the active region of the laser permit lowest order mode selection via a real refractive index waveguiding created by the profile in that region.

Further, enhanced threshold and optical output characteristics with stable fundamental transverse mode operation is provided in an injection laser comprising a plurality of contiguous layers of semiconductor material deposited by MO-CVD on a semiconductor substrate wherein the substrate surface is provided with a nonplanar pattern, e.g., a mesa, channel, or a mesa within a channel, with the pattern having a height limited to less than about 1000 Å but greater than 50 Å. One of the layers of the laser forms an active layer with an active region for optical wave propagation under lasing conditions. The active region has a shape and contour reminiscent of the nonplanar substrate pattern and having the gradual lateral spatial thickness variation (LSTV), although comparatively very small or slight in total thickness change laterally across the active region. These slight thickness variations are more than sufficient to allow for high power nonplanar substrate lasers with kink-free linear operation. The LSTV profile permits lowest order transverse mode selection via a real refractive index waveguiding active region. The desired LSTV profile can be produced in the vapor phase processing by imposing limitations on the size of the nonplanar substrate pattern at the surface of the laser substrate.

Other objects and attainments together with a fuller understanding of the invention will become apparent and appreciated by referring to the following description and claims taken in conjunction with the accompanying drawings.

BRIEF DESCRIPTION OF THE DRAWINGS

The FIG. 2 configurations illustrate various forms of the active region profile greatly enlarged for emphasis.

FIGS. 5 and 6 illustrate other exaggerated models of potential forms of the gradual LSTV profile for the active region as compared to the active region profile shown in FIGS. 2B and 2C.

FIG. 6 illustrates another LSTV profile occurring at active region edges.

DESCRIPTION OF THE PREFERRED EMBODIMENTS

Figure 1:
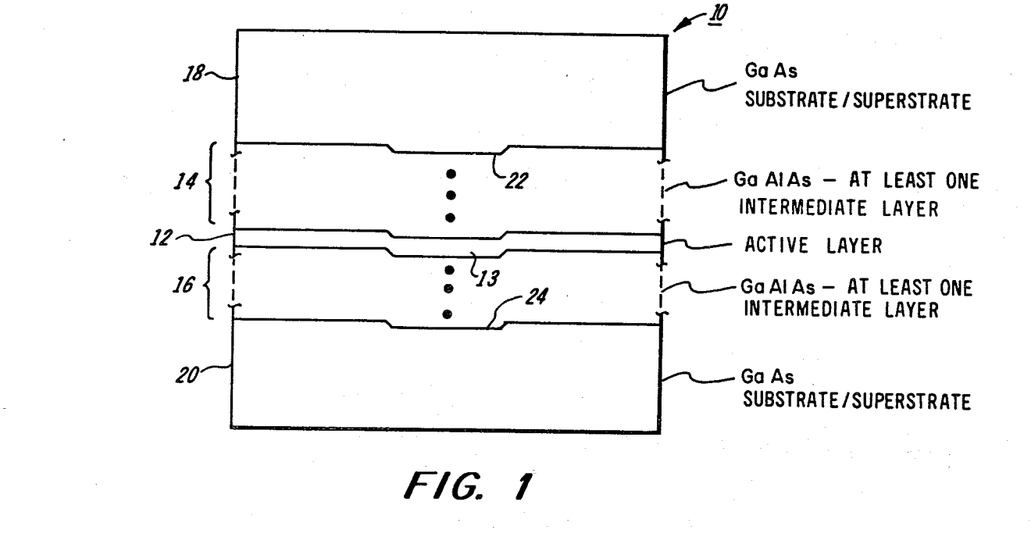
FIG. 1 is a schematic illustration of a portion of a model injection laser with a nonplanar pattern substrate configurations and an active layer with a nonplanar active region.

FIG. 1 illustrates a portion of a model injection laser 10 comprising a plurality of semiconductor layers. These lasers include an active layer 12 which provides optical wave propagation under lasing conditions as is well known in the art. For this illustration, regions 14 and 16 represent one or more cladding and intermediate semiconductor layers conventional in the construction of these lasers.

Active layer 12 has a nonplanar region 13 which is formed during MO-CVD or MBE growth due to a nonplanar pattern provided in the selected substrate 18 or 20. Two different patterns are illustrated by substrates 18 and 20 but, in reality, only one such substrate would be employed in the fabrication process to form the nonplanar active region 13 while the other would represent the superstrate. The nonplanar pattern of substrate 18 is in the form of mesa 22, whereas the nonplanar pattern of substrate 20 is in the form of channel 24.

Model laser 10 and subsequently described structures will be described in conjunction with elemental compounds used in fabricating GaAs/GaAlAs injection lasers. However, other semiconductor materials forming elemental compounds made up of two or more elements from the group consisting of In, Ga, As, P, Sb, N, Al, Pb, Sn, Se, Te, Cd and Zn may be employed in obtaining the desired profile in vapor phase epitaxy.

The description of the MBE equipment and processing that can be used in fabricating lasers comprising this invention can be found in the book entitled, "Molecular Beam Epitaxy", edited by Brian R. Pamplin and published by Pergamon Press Ltd in 1980 and the article entitled, "The Effect of Substrate Temperature on the Current Threshold of GaAs-Al$_x$Ga$_{1-x}$As Double-heterostructure Lasers Grown by Molecular Beam Epitaxy", W. T. Tsang et al., *Applied Physics Letters*, Vol. 36(2), Jan. 15, 1980 and references cited therein. The injection lasers according to this invention, however, will be exemplified particularly in connection with MO-CVD. The description of the MO-CVD equipment and processing that can be used in fabricating lasers comprising this invention can be found in the article entitled, "Preparation & Properties of Ga$_{1-x}$Al$_x$As-GaAs Heterostructure Lasers Grown by Metalorganic Chemical Vapor Deposition" by Russell D. Dupuis and P. Daniel Dapkus, *IEEE Journal of Quantum Electronics*, Vol. QE-15, No. 3, March, 1979 and amplified in U.S. patent application Ser. No. 23/556.

Thin active regions with slight LSTV profiles are believed successful in MO-CVD because of the thinness of the active layer grown, the dimensions of the nonplanar pattern and responsible growth parameters. These intertwined growth parameters make it difficult to understand and describe precisely the optimum growth conditions. The extent of what is known now is given relative to the following parameters. Several parameters are to be considered.

(1) Substrate temperature. The higher the temperature of the substrate, the more the tendency of the layer being deposited to form a facet along a given growth plane. (2) The vapor phase growth is best carried out at atmospheric pressure so that the gases introduced into the MO-CVD reactor have a sufficient degree of random motion to cause initially larger deposits of elemental compounds in regions of corners or edges of nonplanar patterns due to substrate regional temperature differences. (3) Substrate temperature gradient over the substrate, i.e., substrate temperature differences between various substrate regions, possibly influenced by the turbulent effect created on gases flowing over and around substrate edges and nonplanar regions. (4) Variation of gas flux density over nonplanar regions of the substrate. This can be created by variations in the gas flow rates through the MO-CVD reactor. (5) The creation of diffusion gradients at substrate nonplanar pattern edges, particularly at lower gas flow rates. (6) Atomic or molecular surface mobility, i.e., the ability of atoms after being deposited to be influenced in some chemical and/or physical manner to migrate along the substrate surface. (7) Substrate rotation. The substrate is supported on a movable susceptor in a MO-CVD reactor. Motion may be oscillatory or rotatory or a combination of both. In the rotatory case, the substrate is placed on the susceptor offset from the center. This is particulary true over very short distances, such as, for example, nonplanar substrate patterns with small local reliefs. (8) Transverse growth orientation. The growth plane, which includes the nonplanar substrate pattern, is made to be transverse to the crystalographic orientation of the substrate. For example, the substrate surface may be lapped at a very small angle, such as, one degree, and subsequently vapor deposited compounds on the transverse nonplanar substrate surface will tend to favor the crystalographic orientation resulting in spatial thickness variation in layers grown over the nonplanar pattern. (9) Nonplanar substrate pattern misorientation. The orientation of the pattern may be slightly misoriented relative to the growth plane of the substrate.

Figure 2A:
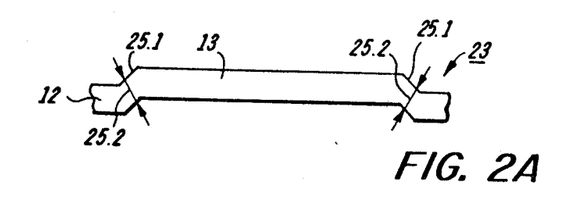
FIG. 2A is one form of the active region for the laser shown in FIG. 1 illustrating the abrupt LSTV profile.

Size, in particular height and width, of nonplanar substrate patterns is important relative to the LSTV profile desired. Two different types of profile are discussed next which can be obtained in vapor phase epitaxy. Nonplanar injection lasers processed in MO-CVD may be provided with what we term as either an abrupt LSTV profile or a gradual LSTV profile or a combination of both. These profiles provide an abrupt thickness variation or a gradual thickness variation, which either separately or in combination, produce an effective, though small, lateral refractive index variation within the active region that improve the waveguiding characteristics and single mode operation of the laser. FIG. 2A illustrates an abrupt profile 23. Note how the ends of the cavity forming the limits of the active region 13 have a transverse index guiding edge or wall 25.1 and slightly thinner transverse region 25.2 that provide real index waveguiding for radiation propagating in the cavity of the active region. Walls 25 need only extend a short distance to function in index guiding propagating radiation.

To produce profile 23, it is preferred that the height of the nonplanar substrate pattern be less than or on the order of the thickness of the active region 13. From experiments conducted in our laboratory, when the height of the pattern, e.g. a substrate mesa, exceeds the thickness of the active region, undesirable higher order transverse modes have been observed. Although the Article of Dupuis et al, supra, claims single transverse mode operation without this active region/pattern height limitation being present in the disclosed laser structure, no data is set forth to indicate that fundamental transverse mode (lowest order) was actually observed.

In the case where very thin active layers are produced, e.g., from about 200 Å to about 1000 Å, the optical wave intensity perpendicular to the plane of the p-n junction spreads substantially into the adjacent cladding layers. This spread of the optical wave intensity allows for a somewhat larger substrate pattern height or width to be used in order to still maintain fundamental mode operation. As an example, a 500 Å active layer thickness might utilize a 4 μm wide by 200 Å high substrate pattern.

Figure 2B:
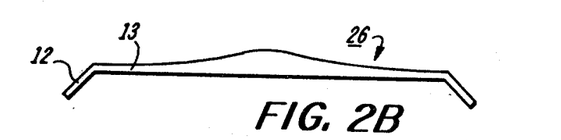
FIG. 2B is another form of the active region for the laser shown in FIG. 1 illustrating a gradual LSTV profile.

FIG. 2B illustrates a gradual LSTV profile. In FIG. 2B, a gradual convex shaped LSTV profile 26 is illustrated. The thickest portion of the active region 13 is central and the spatial thickness decreases toward the ends of the region.

Figure 2C:
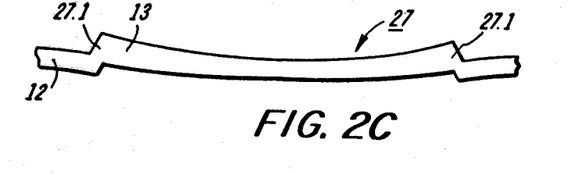
FIG. 2C is another form of the active region for the laser shown in FIG. 1 illustrating a combination abrupt and gradual LSTV profile.
Figure 2D:
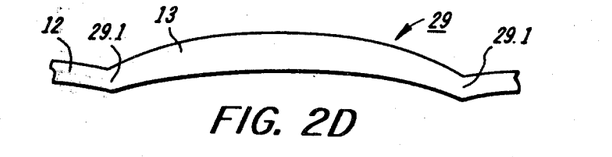
FIG. 2D is still another form of the active region for the laser shown in FIG. 1 illustrating a combination abrupt and gradual LSTV profile.
Figure 2E:
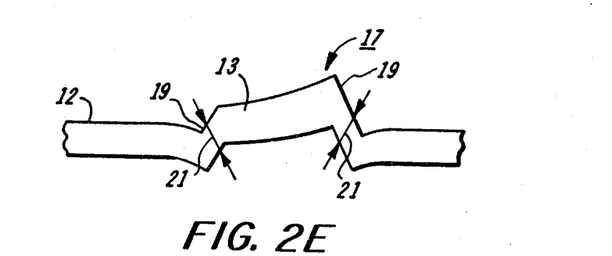
FIG. 2E is a further form of the active region for the laser shown in FIG. 1 illustrating a combination abrupt and gradual LSTV profile.

FIGS. 2C, 2D and 2E illustrate combinations of the abrupt and gradual spatial thickness variation in the same profile. In FIG. 2C, a gradual concave shaped LSTV profile 27 is illustrated. The thickest portions of the active region 13 are at region ends and the spatial thickness decreases toward the center of the region. In FIG. 2D, the LSTV profile 29 is convex shaped with a spatial thickness variation through the active region as well as having thinner transverse regions 29.1 to provide real index waveguiding. In FIG. 2E, there is a gradual variation in thickness in profile 17 as well as an abrupt variation in the form of walls 19 and thinner transverse regions 21.

Although we have discovered that these various profiles can be reproduced in MO-CVD, we have not yet fully realized and sufficiently understand, at this point, the interrelationship of the various growth parameters, previously touched upon, to accurately define and qualify these parameter and their limits for repeated replication of any one of these profiles in the fabrication of injection lasers in MO-CVD. However, these profiles are possible to produce in MO-CVD. This reality is of particular interest in the case of gradual LSTV profiles since we do not know of any prior discovery or knowledge by others that such curved and tapered contours were thought possible in MO-CVD with nonplanar substrate patterns that have flat local reliefs. To the contrary, it has been the belief of others that MO-CVD layer growths over nonplanar substrate patterns having flat local reliefs would replicate the features of the flat reliefs. We have found that this is not necessarily the case.

In particular cases of gradual LSTV profiles, we have found that if the nonplanar substrate pattern, e.g., mesa 22 or channel 24, is sufficiently small in size and geometry, very slight LSTV profiles will appear in the active region 13, which are quite desirable for fundamental mode operation. If patterns 22 and 24, for example, have a height in the range of about 50 Å to 1000 Å and a width of about 1 $\mu$m to 10 $\mu$m (or possibly more, such as 20 $\mu$m), a gradual convex shaped LSTV profile 26 of FIG. 2B or a gradual concave shaped LSTV profile 27 of FIG. 2C is possible. The differences in these two profiles is primarily due to the above mention parameters and, in particular, parameters (5) and (6). The spatial variation is very small, being less than several hundred Å from the thickest point to the thinnest point of the active region 13. The better examples having desired LSTV profiles thus far fabricated have shown desirable nonplanar patterns of about 2–6 $\mu$m wide with a pattern height between 200 Å to 500 Å. The active region 13 in such cases will be less than about 3 $\mu$m above the substrate and have a thickness of less than 4000 Å at thickest point, for example, about 0.05 to 0.3 $\mu$m with a spatial thickness variation from the maximum to minimum of about 20 Å to 600 Å. With such small dimensions, it is very difficult to discern the exact nature of the gradual LSTV profile of the active region 13. However, the LSTV profile is present, whatever its contour, as explained later relative to the example set in FIG. 7 et seq.

Figure 3:
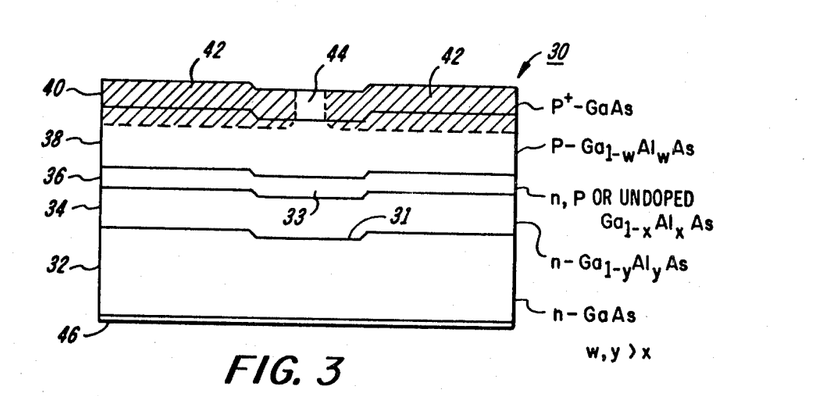
FIG. 3 is a schematic illustration of an injection laser with nonplanar substrate pattern in the form of a channel in the surface of the laser substrate.
Figure 4:
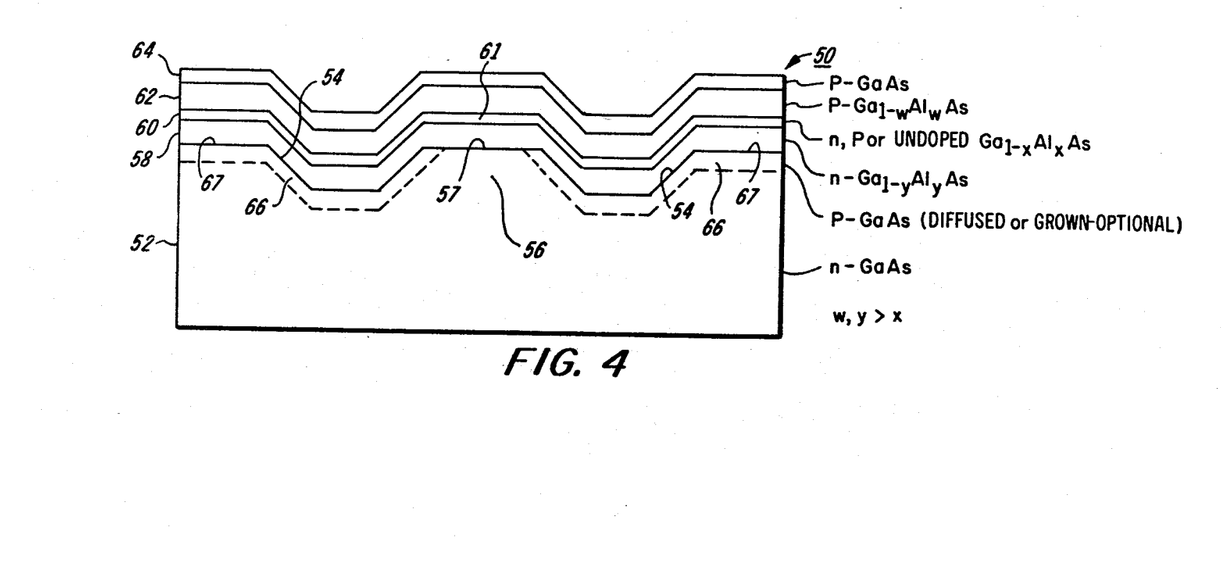
FIG. 4 is a schematic illustration of an injection laser with a nonplanar substrate pattern in the form of a mesa in a channel configuration.

From the model laser of FIG. 1 we proceed to the injection laser embodiments shown in FIGS. 3 and 4. In FIG. 3, laser 30 is a channelled substrate nonplanar laser of conventional design except being grown in MO-CVD with small channel geometry. Laser 30 comprises a substrate 32 of n-GaAs, cladding layer 34 of n-Ga$_{1-y}$Al$_y$As, an active layer 36 of n, p or undoped Ga$_{1-x}$Al$_x$As, a cladding layer 38 of Ga$_{1-w}$Al$_w$As and capping layer 40 of p+GaAs. The molar requirements for this and other embodiments is w, y>x. Current confinement is provided by proton or ion implanted regions 42 forming the current channel 44. Other conventional current confinement schemes may also be utilized in these laser structures. A metalization layer 46 provides for n side contact while a contact applied to the region of channel 44 provides for p side contact.

A nonplanar pattern in the form of channel 13 is provided in the surface of substrate 32. Channel 31 is 250 Å deep. Layer 34 may be about 2.5 $\mu$m thick while active layer 36 has an active region 33 of about 0.2 $\mu$m thick and has an LSTV differential of less than 100 Å, e.g. 70 Å. The profile may be either of the profiles shown in FIGS. 2B or 2C. A deeper channel 31 of, for example, 5000 Å and a 0.2 $\mu$m thick active region 33 can provide the abrupt LSTV profile 23 of FIG. 2A.

Figure 3A:
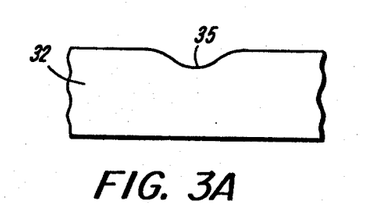
FIG. 3A is a curved contour form of substrate channel shown in FIG. 3.

FIG. 3A illustrates a modified pattern for substrate channel 31. Concave channel 35 has a rounded channel bottom that may be produced by a controlled selective etch or multiple etchants. This rounded shape imposes on the LSTV profile a more lens like shaped contour, which is desirable in the LSTV profile.

The employment of a flat surfaced channel or mesa may provide a sharp variation in the index of refraction at the edges of the nonplanar pattern during growth of subsequent semiconductor layers. Channel 35 will provide for more uniformity of growth in the regions of these edges.

A special selective etch may be used that will tend to round all the pattern edges, producing either a concave channel or convex mesa. An example of such an etch is $H_2SO_4$, $H_2O_2$ and $H_2$ mixed in a ratio of 5:1:1. A multiple step etch may be necessary to achieve the desired substrate surface contour. The resultant LSTV profile in the active region will depend considerably on the growth rate, growth temperature, and gas flow rates in the MO-CVD reactor as well as the overall dimensions of the rounded substrate pattern employed.

Figure 3B:
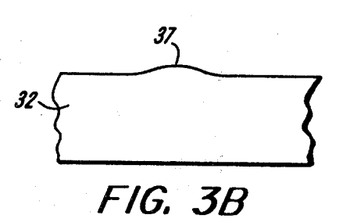
FIG. 3B is a curved contour mesa substrate pattern.
Figures 3C, 3D:
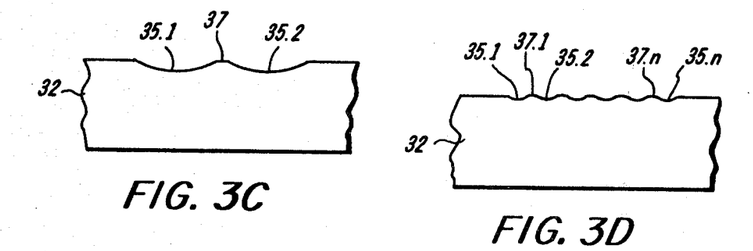
FIG. 3C is a curved contour mesa in a curved contour channel.
FIG. 3D is an illustration of a multiple curved contour substrate pattern.

FIG. 3B illustrates a modified substrate pattern comprising a convex curved mesa 37. FIG. 3C illustrates the employment of curved concave channels 35.1 and 35.2 in the substrate 32. FIG. 3D illustrates that an array of several channels 35.1, 35.2, . . . 35.n (or mesas 37.1 to 37.n) may be closely spaced to provide for optical coupling among an array of active regions form on substrate 32.

Figure 3E:
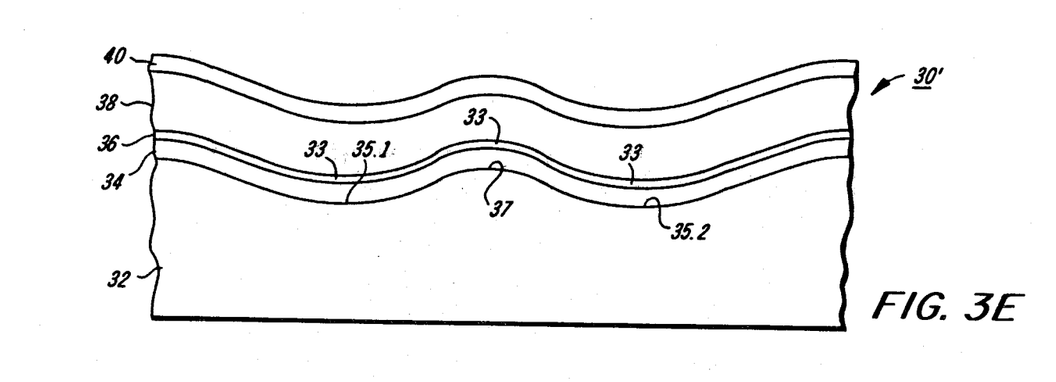
FIG. 3E is a schematic illustration of an injection laser with nonplanar substrate pattern having the form shown in FIG. 3C.

FIG. 3E illustrates an injection laser structure grown in MO-CVD employing a substrate 32 disclosed in FIG. 3C. The laser 30' comprises the same semiconductor layers of laser 30 of FIG. 3. Conventional means for current confinement and contact metalization are not shown. To be noted is the fairly uniform thickness of layer growth over the concave channels 35.1 and 35.2 and the convex mesa 37.1. However, for very thin layers, such as active layer 36 in the active regions 33, the LSTV profile will be produced, these profiles being shown somewhat exaggerated in this Figure for purpose of clarity.

The injection laser 50 shown in FIG. 4 illustrates a substrate 52 provided with a nonplanar pattern comprising a substrate channel 54 within which is formed a mesa 56. This configuration can be conventionally fabricated by selective etching. On substrate 52 of n-GaAs, there is consecutively deposited cladding layer 58 of n-Ga$_{1-y}$Al$_y$As, active layer 60 of n, p or undoped Ga$_{1-x}$Al$_x$As, cladding layer 62 of p-Ga$_{1-w}$Al$_w$As and capping layer 64 of p-GaAs. Conventional current confinement and contact metalization are not shown. The diffused or grown regions 66 of p-GaAs on substrate 52 are optional and provide reverse junction regions to confine current through the region of mesa 56. This technique is known in the art.

In this embodiment, the width of channel 54 may be, for example, 15 μm and mesa 56 may be about 6 μm wide and 250 Å high. MO-CVD growth with this mesa/channel geometry provides a gradual LSTV profile similar to FIGS. 2B and 2C for thin active regions 61, for example, less than 0.5 μm in height. The rapidity of the LSTV can be increased or decreased by increases or decreases in the depth of the channel 54 and the proximity of the adjacent mesas represented by surfaces 67. The aspects and attributes of this function and resultant mode control are discussed in U.S. Pat. No. 4,335,461. Active regions 61 with larger thicknesses will tend to flatten out and become linear without any LSTV profile sufficient (if at all present) to perform the desired real refractive index guiding function. However, active layers 61 with similar thicknesses deposited on higher mesas 57 will produce the abrupt LSTV profile 23 shown in FIG. 2A. Active region 61 is applicable to all the profiles shown in the FIG. 2 illustrations.

A modification of laser 50 would be to make the height of the substrate surfaces 67 either higher or lower compared to the height 57 of mesa surface 57. These changes in height will have a resultant effect on the LSTV profile of region 61. An increase in height of surfaces 67 relative to mesa surface 57 will increase the differential amount of the LSTV as well as the overall region thickness for a given growth rate. A decrease in height of surfaces 67 relative to mesa surface 57 will reduce the differential amount of the LSTV as well as the overall region thickness for the same given growth rate.

As previously indicated, the exact nature of the contour of the LSTV profile of the active region formed over nonplanar substrate patterns is not readily discernable. Its exact nature not being entirely clear, other possibilities are considered. FIGS. 5 and 6 illustrate exaggerated profile details in connection with injection laser 70 comprising substrate 72 of n-GaAs having a mesa 73, cladding layer 74 of n-Ga$_{1-y}$Al$_y$As, active layer 76 of n, p or undoped GaAs or Ga$_{1-x}$Al$_x$As, cladding layer 78 of p-Ga$_{1-w}$Al$_w$As and capping layer 80 of p$^+$-GaAs with proton implant regions 82 to form the current confinement channel 84. Contacts are not shown. In each of the Figures, the LSTV profile is quite different from that shown in FIG. 2 but the resultant effect relative real refractive index waveguiding and mode control is the same.

Figure 5A:
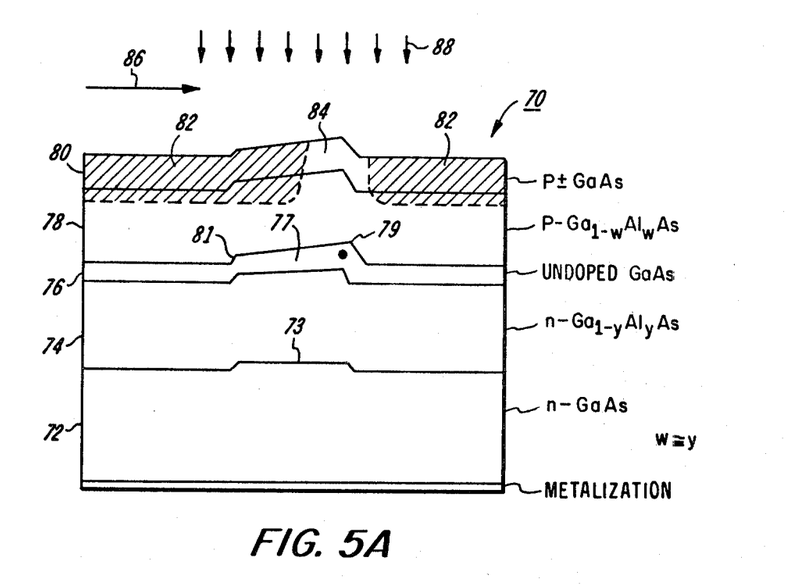
FIG. 5A illustrates a tapered profile having a LSTV profile produced by substrate movement or rotation relative to MO-CVD gas flow.
Figure 6:
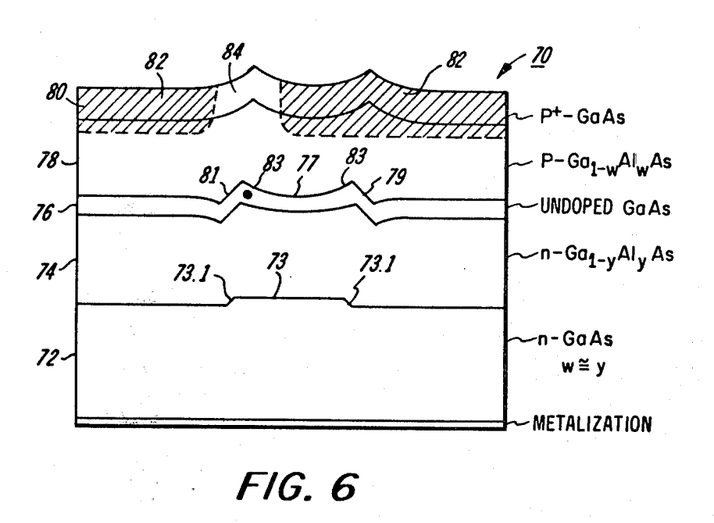

In FIG. 5A, the LSTV profile in the active region 77 is in the form of a taper being of larger thickness at one edge 79 of region 77 and tapering to its smallest thickness at the other edge 81 of region 77. Such an LSTV taper can be produced by relative rotation or linear movement (indicated by arrow 86 and previously mentioned) of substrate 72 in a direction transverse to the longitudinal extent of the mesa 73 and also at a transverse shear to the gas flow indicated by arrows 88. This transverse shear effect may be also produced in a MO-CVD horizontal reactor wherein the gases flow over and across the nonplanar substrate surface. In all these cases, region 77 will grow thicker at the leading edge 79. The current confinement channel 84 is formed to be offset and over the thickest portions of region 77 at edge 79.

Figure 5B:
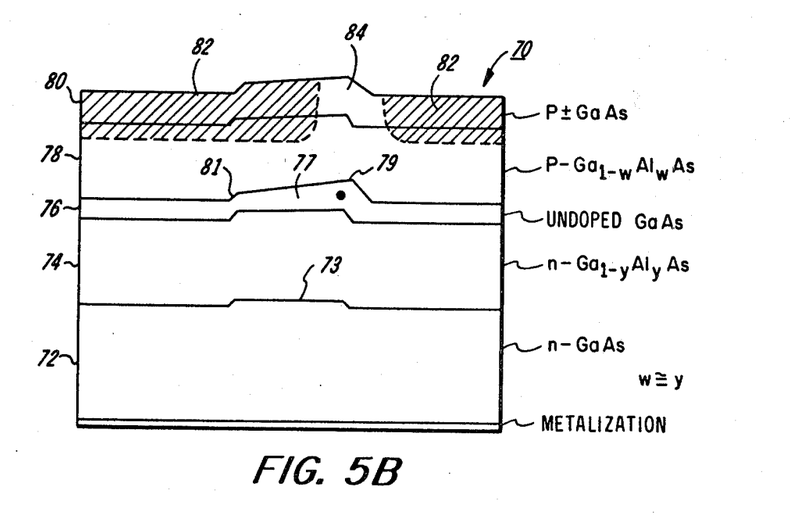
FIG. 5B illustrates a tapered profile having a LSTV profile produced by misorientation of nonplanar pattern on the substrate relative to the crystal orientation of the substrate.

The same tapered LSTV profile is also formed in region 77 of laser 70 shown in FIG. 5B. The edge 79 is the largest thickness of region 77 tapering to its smallest thickness at the other edge 81 of region 77. This tapered LSTV profile is formed by a slight misorientation of the single crystal substrate relative to the longitudinal extent of the mesa 73. Substrate 72 may, for example, be misoriented one half of a degree or more measured from a plane perpendicular to the length of mesa 73. Because of this misorientation, the deposited crystalline growth tries to grow back to a perfect crystalline orientation and in doing so creates a tapered contour across active region 77. The amount of taper formed will depend upon growth parameters as well as the amount of pattern misorientation and pattern dimensions. The current confinement channel 84 is formed to be offset and over the thickest portions of region 77 at edge 79.

FIG. 6 shows the active region profile 27 of FIG. 2C. In this particular situation, a pair of thicker regions 83 over the mesa edges 73.1 and 73.2 appear at each actve region edge 79 and 81. The offset current confinement channel 84, positioned over one of the regions 83, will provide lowest order mode operation, the designated region performing the functional index waveguiding due to LSTV profile of the region 83. It is possible that these regions may be developed due to a rounding of the two edges of the meas 73 when etched in the substrate 72. Also these regions may be developed due to growth conditions and surface kinetics, in particular, flux variation densities, diffusion gradients and atomic surface mobility.

As a specific example of the previously discussed embodiments, the remaining figures relate to the fabrication in MO-CVD of nonplanar substrate injection lasers each having a mesa of the same small height but of several different mesa widths and whose operational characteristics are compared to a planar substrate laser produced from the same MO-CVD growth.

Figure 7:
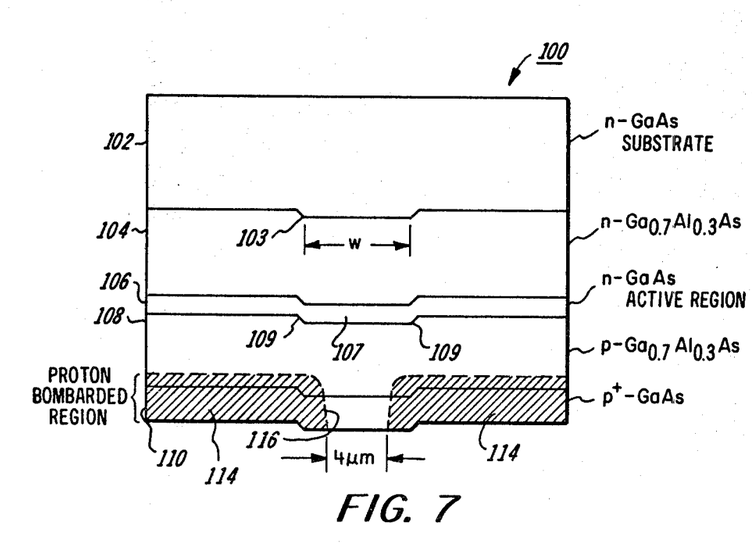
FIG. 7 is a schematic illustration of an injection laser with a nonplanar substrate pattern in the form of a mesa on the surface of the laser substrate.

A schematic diagram of the mesa waveguide structure of each of these fabricated lasers 100 is shown in FIG. 7. The mesa shape of the active region 107, which results after etching of the n-GaAs substrate prior to crystal growth, propagates up through the grown layers 104-110 as the MO-CVD process proceeds. As will be seen, however, the device characteristics set forth below compel a conclusion that the active layer is not completely flat across the mesa region 107 but instead tapers slightly from a maximum thickness located laterally above the center of the mesa 103. Thus, transverse mode control and waveguiding in these lasers is believed to be provided by a LSTV profile in the form of a lens-like active region in contast to channel guide lasers grown by MO-CVD, which have been said to exhibit gain guiding characteristics due to bends or offsets in the active region 107 at the edges 109. [See the Article entitled, "Single-longitudinal-mode CW Room-temperature Ga$_{1-x}$Al$_x$As-GaAs Channel-guide Lasers Grown By Metalorganic Chemical Vapor Deposition", R. D. Dupuis and P. D. Dapkus, *Applied Physics Letters*, Vol. 33, page 724 et seq. (Oct. 15, 1978)]. However, the active region taper thickness differential, which is believed to be on the order of 100 Å per micron, is too small to be observed by conventional SEM equipment.

In fabricating the devices, mesas of width, w, equal to 2, 4, 6 and 8 μm are formed on n-(100) GaAs:Si doped substrates 102 by using projection exposure of photo resist. This procedure maintains accurate mesa widths. Following masking, chemical etching with 1 HF:6 H$_3$PO$_4$:30 H$_2$O$_2$:120 ethylene glycol is used to delineate a shallow mesa 103. A major advantage of this particular solution is that its etch rate is very well controlled and thus gives reproducible mesa heights, which is an important parameter in maintaining single transverse mode operation in these devices. The mesa waveguide lasers 100 described herein are grown atop 500 Å high mesas. The mesa pattern consists of adjacent strips 2, 4, 6 and 8 μm wide, oriented parallel to the [011] direction. Each strip is separated by 500 μm from an adjacent mesa on the same wafer and the pattern is repeated across the wafer.

Following substrate preparation, five successive crystal layers are grown under atmospheric pressure MO-CVD in a vertical reactor of type disclosed in U.S. patent application Ser. No. 231,556. The laser 100 comprises: (1) n-GaAs buffer layer 105, about 1.2 μm thick, Se-doped about $1 \times 10^{18}$ cm$^{-3}$; (2) cladding layer 104 of n-Ga$_{0.7}$Al$_{0.3}$As, about 2 μm thick, Se-doped about $3 \times 10^{17}$ cm$^{-3}$; (3) undoped GaAs active layer 106 about 0.15 μm thick; (4) cladding layer 108 p-Ga$_{0.7}$Al$_{0.3}$As, about 2.6 μm thick, Zn-doped about $2 \times 10^{18}$ cm$^{-3}$; and capping layer 110 p-GaAs, about 1.1 μm thick, Zn-doped about $5 \times 10^{19}$ cm$^{-3}$.

Current confinement for these mesa waveguide lasers is provided by implanting 100 KeV protons outside a 4 μm wide mask. The implantation depth 114 is quite shallow, as illustrated in FIG. 7. Mask alignment is simple because the mesa pattern is visible at the top surface of the wafer. The resulting 4 μm wide current-conducting channel 116 is thus easily centered over the 2, 4, 6 and 8 μm wide mesas 107. The wafer is then metallized, for example, with Cr/Au on the p-side and AuGe on the n-side, although other combinations of metals are also suitable. It is cleaved into bars about 200–275 μm in length and mounted on Au-plated copper headers.

Figure 8:
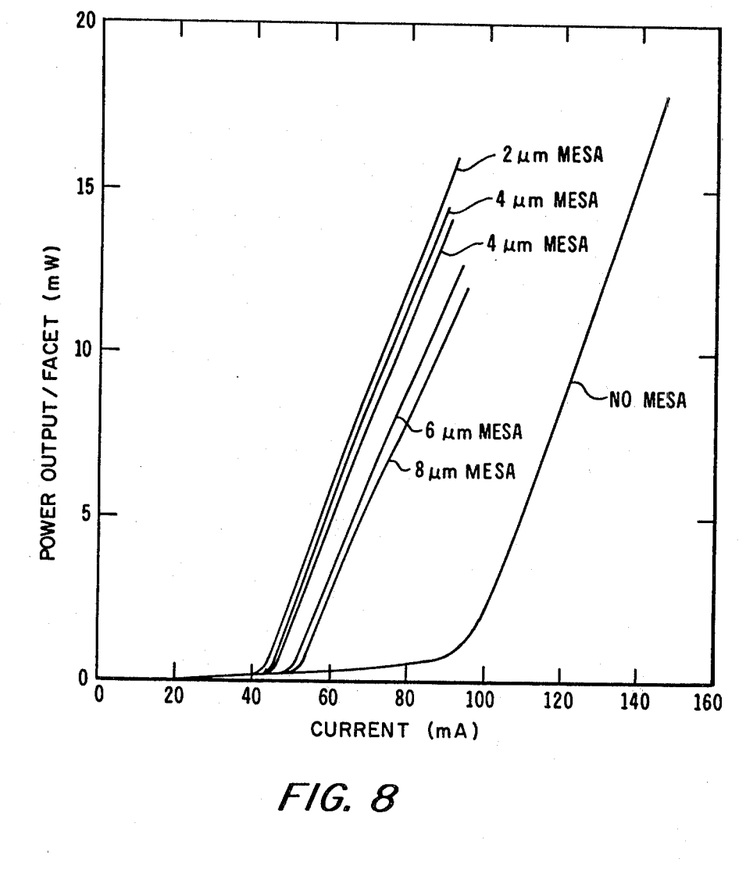
FIG. 8 is the pulsed radiation output versus current characteristics for MO-CVD grown nonplanar injection lasers having 2, 4, 6 and 8 $\mu$m wide mesas on the laser substrate for comparison with a MO-CVD grown planar injection laser having no mesa on the surface of the laser substrate.
Figure 9A:
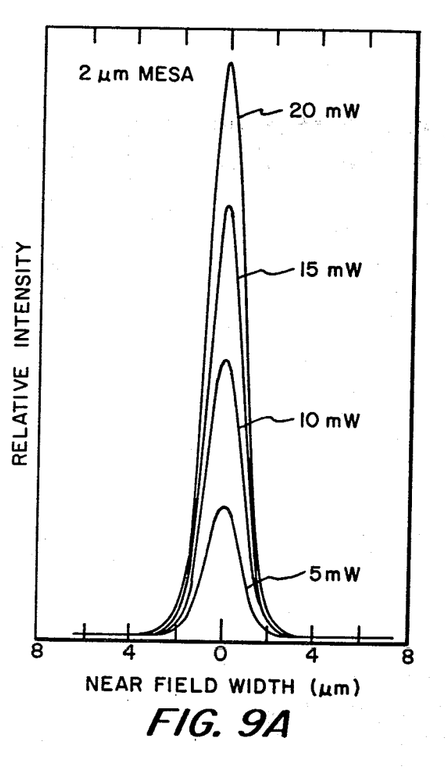
FIGS. 9A–9D illustrate the near field patterns respectively for 2, 4, 6 and 8 $\mu$m wide mesa lasers at different optical power levels per facet.
Figure 9B:
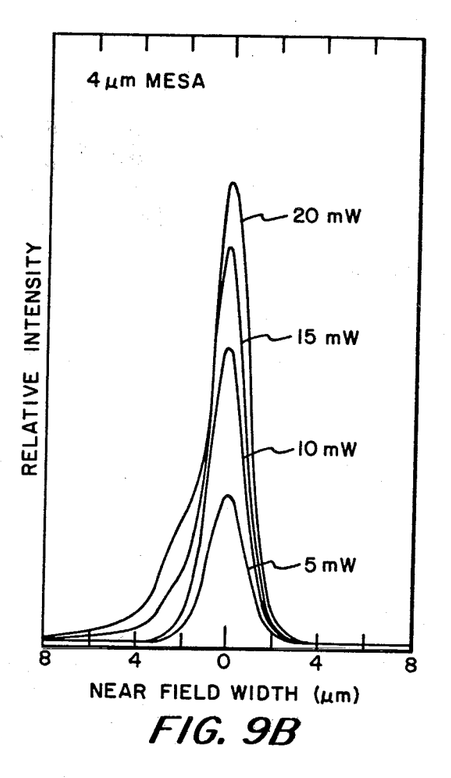
Figure 9C:
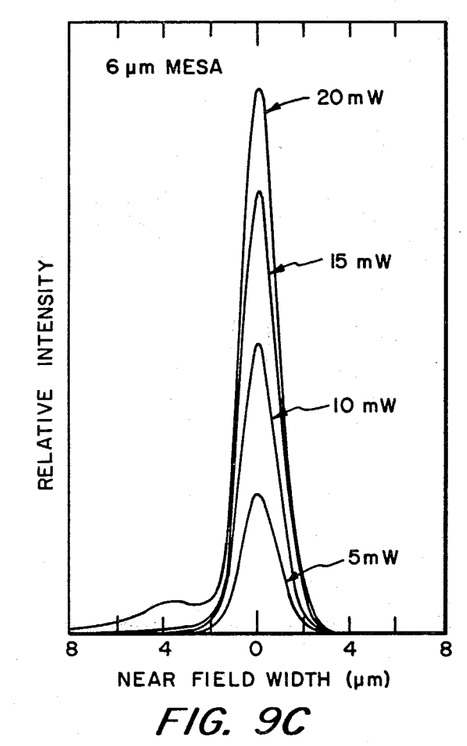
Figure 9D:
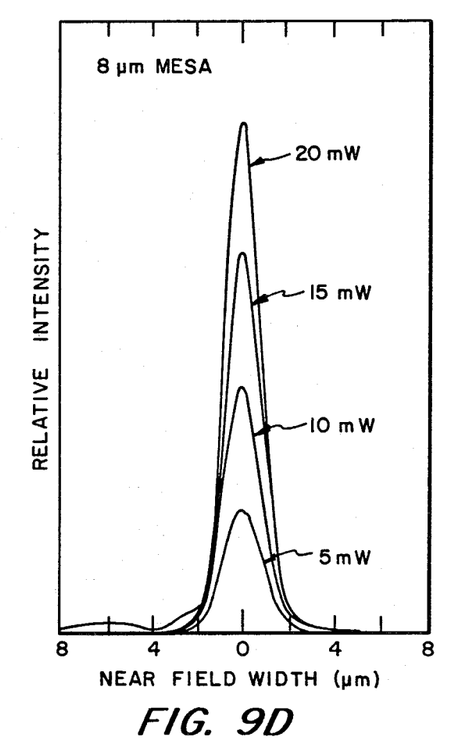
Figure 10A:
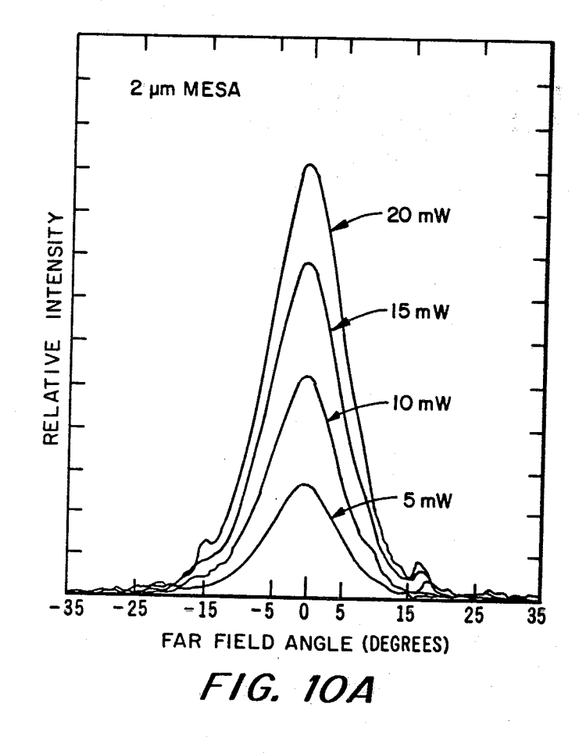
FIGS. 10A–10D illustrate the far field patterns respectively for 2, 4, 6 and 8 $\mu$m wide mesa lasers at different optical power levels per facet.
Figure 10B:
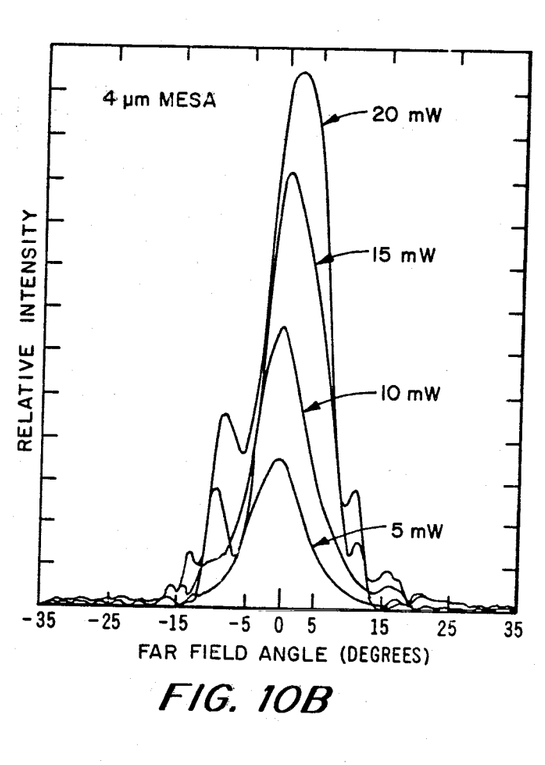
Figure 10C:
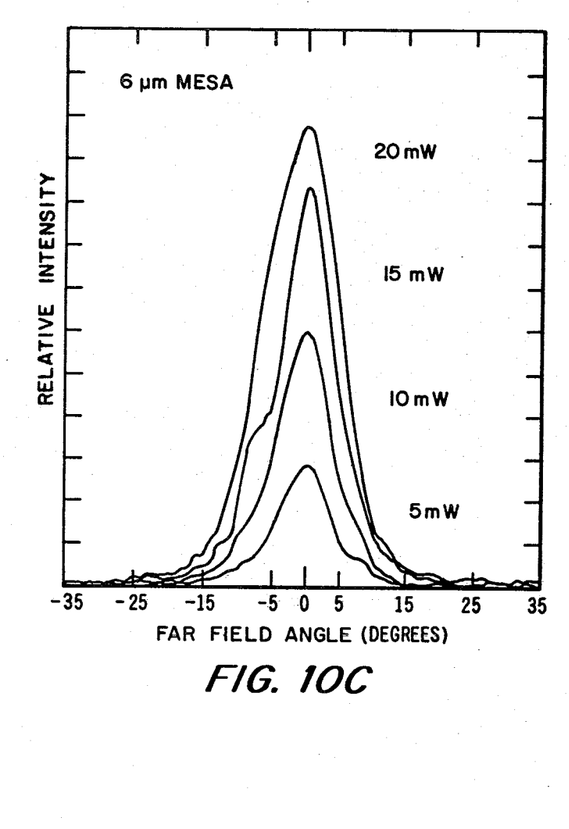
Figure 10D:
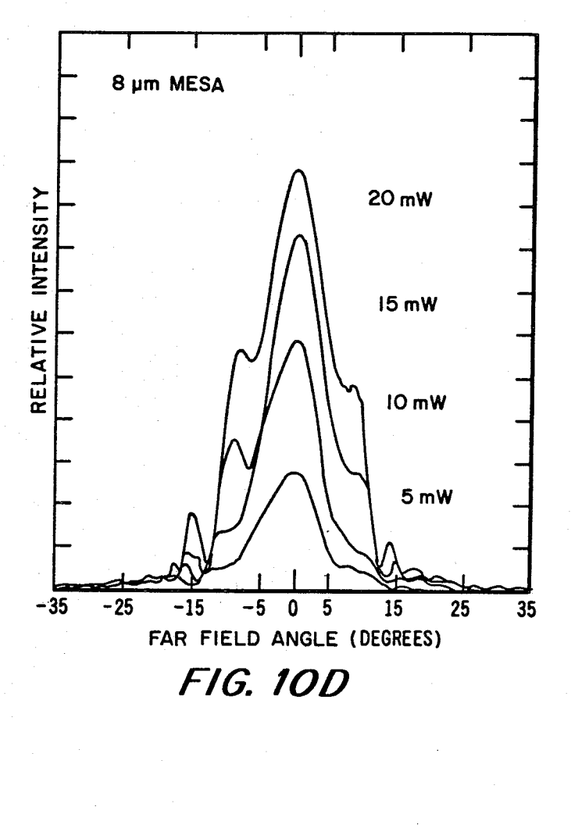

The fabricated lasers were tested under both pulsed (300 nsec, 10 KHz) and CW operation. Under the latter conditions, thresholds increased by less than 10%, and, in a representative case, differential quantum efficiency decreased from 48% to 44%. Pulsed light output vs. current (L vs. I) curves for MW lasers (labled "2, 4, 6 and 8 μm MESA") on a 275 μm long bar are depicted in FIG. 8. Also shown is a typical L vs. I curve (labeled "NO MESA") for a 4 μm wide stripe gain-guided injection laser approximately 275 μm long taken from a second wafer which was grown and processed simultaneously with the mesa lasers 100. Consequently, the two wafers differ only in that one has mesas formed by etching the substrate prior to growth whereas the other substrate is featureless. As is evident from an examination of FIG. 8, the mesa laser thresholds are a factor of two lower than the 4 μm wide gain-guided featureless laser. This perhaps rather surprisingly large reduction in threshold is believed to result both from improved light guiding by the mesa waveguide and to enhanced charge diffusion toward the thickest part of the active region where the optical mode is the strongest. Both of these effects are a consequence of the LSTV profile of the active region.

It should be noted that the threshold current of the various mesa lasers 100 decreased slightly and the differential quantum efficiency increased slightly with decreasing mesa width. This result was typical of over 100 different lasers that were tested. Also, slight nonlinearities in the L vs. I curves of the mesa lasers can be observed at about 8 mW for the two 4 μm mesa lasers, at about 7 mW for w=6 μm, and at about 6 mW for w=2 μm. The 2 μm mesa lasers were in all cases the most linear of the laser structures, exhibiting only a very slight curvature in the L vs. I characteristic. No distinct kinks were evident in these very narrow mesa lasers.

The catastrophic damage level of lasers with 2 μm mesas occurred at 25 to 30 mW. Limits for lasers with wider mesas were only slightly higher (10–20%). Such low catastrophic damage limits which are almost independent of mesa width are readily understood if one examines the near field mode pattern of the mesa lasers 100 shown in FIGS. 9A-D respectively for adjacent, 2, 4, 6 and 8 μm wide mesa lasers whose L vs. I curves are shown in FIG. 8. Clearly, the near field mode width is about 2 μm for all mesa widths. From this data, the conclusion reached is that the active regions are tapered with LSTV, for without such a taper the near-field mode widths would increase noticeably with mesa width. Small increases in mode width with w are consistent with the catastrophic damage data. As shown in FIG. 9, the near field widths do appear to increase very slightly with w, but such variations in the near field are almost unresolvable at the operating wavelengths. Finally, in focusing these lasers, no astigmatism was observed. Thus, it is evident that these devices are real refractive index-guided.

The far field patterns of the mesa lasers 100 are shown in FIGS. 10A–10D, corresponding to the near field patterns of FIGS. 9A–9D. Far field divergence to the half-power points is very close to 10°, and, for w=2 μm, the divergence slightly exceeds that of the other lasers in the single transverse mode operating regime. The 10° full-width half-power (FWHP) far field divergence is consistent with a 2.0 μm FWHP planar Gaussian near field. Note that the w=4, 6 and 8 μm mesa lasers operate single spatial mode to power levels between 5 and 10 mW, whereas the w=2 μm mesa laser maintains a single lobe mode pattern to over 20 mW of optical output power per facet.

Lasers, similar in design to laser 100, were also grown over 1000 Å, 2000 Å and 4000 Å high mesas. These devices operated in the lowest order transverse mode but at substantially lower output power levels, less than 3–5 mW. Above this power level, higher-order lateral modes were excited along the junction plane. With the larger mesa height, apparently, a large change in real refractive index weas induced, leading to high order mode operation. Thus, both mesa height and width are critical parameters in obtaining optimal laser performance from laser 100.

Single longitudinal mode operation was also obtained for the w=2 μm lasers 100 to output power levels in excess of 20 mW, CW. Spectral purity continues to increase above threshold, as expected of a homogeneously broadened laser. At 2 $I_{TH}$, which corresponds to an output power level of about 20 mW, the ratio of the intensity of the major longitudinal mode is approximately 180 times as intense as the adjacent longitudinal mode, which latter mode is second in intensity relative to the principle mode. Thus, the spectral purity is quite high, as is typical of real refractive index-guided lasers.

In conclusion, although it is commonly believed that crystal growth using MO-CVD reproduces substrate features with uniform thickness, we have discovered that, for example, for thin growth layers and small mesa heights, growth is not perfectly uniform, but is sufficiently inhomogeneous to produce a tapered active region or LSTV profile with both optical waveguiding and charge concentration properties necessary for good mode control. The lasers which result have linear L vs. I characteristics, operate single lowest order transverse mode, produce an anastigmatic output beam, and generate an essentially single longitudinal mode spectrum up to their catastrophic damage limit.

While the invention has been described in conjunction with specific embodiments, it is evident that many alternatives may be applicable. For example, the active region profiles discussed can also be provided in multiple quantum well lasers, large optical cavity (LOC) lasers, buried heterostructure lasers and other known types of injection lasers. Accordingly, the invention as described is intended to embrace all such alternatives, modifications, and variations as fall within the spirit and scope of the appended claims.

What is claimed is:

1. In an injection laser comprising a plurality of contiguous layers of semiconductor material deposited by chemical phase epitaxy on a semiconductor substrate, said substrate provided with a nonplanar pattern, one of said layers forming an active layer with a nonplanar active region for optical wave propagation under lasing conditions, the improvement comprising
   a continuous lateral spatial thickness variation transversely across said active region wherein the thickness of said active region is slightly greater along at least one portion of said active region compared to the remainder of said active region, said variation to provide an effective lateral refractive index variation within said active region thereby permitting the maintenance of the lowest order transverse mode along the plane of said active region about said one portion of said active region.

2. In the injection laser of claim 1 wherein said nonplanar pattern comprises a mesa.

3. In the injection laser of claim 2 wherein said mesa has a convex contour.

4. In the injection laser of claim 1 wherein said nonplanar pattern comprises a plurality of mesas.

5. In the injection laser of claim 1 wherein said nonplanar pattern comprises a channel.

6. In the injection laser of claim 5 wherein said channel has a concave contour.

7. In the injection laser of claim 1 wherein said nonplanar pattern comprises a plurality of channels.

8. In the injection laser of claim 1 wherein said nonplanar pattern comprises a mesa within a channel.

9. In the injection laser of claim 8 wherein said mesa has a convex contour and said channel has a concave contour.

10. In the injection laser of claim 1 wherein current confinement means is centered over said nonplanar substrate pattern.

11. In the injection laser of claim 1 wherein current confinement means is offset relative the symmetry of said nonplanar substrate pattern.

12. In the injection laser of claim 1 wherein said lateral spatial variation is characterized by having a tapered lateral spatial variation such that said active region has a thicker cross-section at least along one edge of said active region, and current confinement means aligned parallel with said thicker edge and positioned in a plane transverse to the plane of said active layer, said plane extending through said thicker edge of said active region.

13. In the injection laser of claim 1 wherein the thickness of said active region is greater than the height of said nonplanar pattern, said height being in the range of 50 Å to 1000 Å and in the range of 1 $\mu$m to 20 $\mu$m, the lateral spatial thickness variation in said active region being from a minimum thickness to maximum thickness within the range of 20 Å to 600 Å.

14. In the injection laser of claim 1 wherein said lateral spatial variation is further characterized by having a tapered lateral spatial variation such that said active region has a thicker cross-section at least along one edge of said active region, and current confinement means positioned in a plane transverse to the plane of said active layer, said plane extending through said thicker edge of said active region.

15. In the injection laser of claim 1 wherein said active region portion is along one edge of said active region.

16. In the injection laser of claim 1 wherein said active region portion is along both edges of said active region.

17. In the injection laser of claim 1 wherein said active region portion is intermediate of the edges of said active region.

18. In the injection laser of claim 1 wherein said lateral spatial thickness variation is, in part, created by misorientation of the nonplanar pattern relative to the growth plane of said substrate.

19. In the injection laser of claim 1 wherein said lateral spatial thickness variation is, in part, created by misorientation of the nonplanar pattern relative to the crystallographic orientation of said substrate.

20. In the injection laser of claim 1 wherein said lateral spatial thickness variation is, in part, created by rotation of said substrate during said chemical phase epitaxial deposition.

21. In the injection laser of claim 1 wherein said lateral spatial thickness variation is, in part, created by linear movement of said substrate in a direction transverse to the elongated extent of the nonplanar pattern during said chemical phase epitaxial deposition.

* * * * *